United States Patent
Manipatruni et al.

(10) Patent No.: US 11,398,596 B2
(45) Date of Patent: Jul. 26, 2022

(54) MAGNETIC TUNNEL JUNCTION (MTJ) INTEGRATION ON BACKSIDE OF SILICON

(71) Applicant: Intel Corporation, Santa Clara, CA (US)

(72) Inventors: Sasikanth Manipatruni, Portland, OR (US); Tanay Gosavi, Hillsboro, OR (US); Ian Young, Portland, OR (US); Dmitri Nikonov, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 881 days.

(21) Appl. No.: 16/022,519

(22) Filed: Jun. 28, 2018

(65) Prior Publication Data

US 2020/0006627 A1    Jan. 2, 2020

(51) Int. Cl.
| | | |
|---|---|---|
| *H01L 43/02* | (2006.01) | |
| *G11C 11/16* | (2006.01) | |
| *H01L 27/22* | (2006.01) | |
| *H01L 43/10* | (2006.01) | |

(Continued)

(52) U.S. Cl.
CPC ............ *H01L 43/02* (2013.01); *G11C 11/161* (2013.01); *H01L 27/228* (2013.01); *H01L 43/10* (2013.01); *H01L 43/12* (2013.01); *H01L 27/226* (2013.01); *H01L 43/06* (2013.01)

(58) Field of Classification Search
CPC ....... H01L 43/02; H01L 27/228; H01L 43/10; H01L 43/12; H01L 27/0694; H01L 43/08; H01L 27/226; H01L 43/06; G11C 11/161; G11C 11/1659; G11C 11/1673; G11C 11/1675
See application file for complete search history.

(56) References Cited

U.S. PATENT DOCUMENTS

| 9,620,188 B2 | 4/2017 | Manipatruni et al. | |
|---|---|---|---|
| 2002/0175357 A1* | 11/2002 | Kim ...................... | B82Y 10/00 257/296 |

(Continued)

FOREIGN PATENT DOCUMENTS

| WO | WO 2014/204492 | 12/2014 |
|---|---|---|
| WO | WO 2017/057046 | 4/2017 |

(Continued)

OTHER PUBLICATIONS

Office Action from European Patent Application No. 19175812.7 dated Feb. 20, 2020, 12 pgs.

(Continued)

*Primary Examiner* — Patricia D Valenzuela

(74) *Attorney, Agent, or Firm* — Schwabe, Williamson & Wyatt, P.C.

(57) ABSTRACT

A memory device comprises a substrate having a front side and a backside, wherein a first conductive line is on the backside and a second conductive line is on the front side. A transistor is on the front side between the second conductive line and the substrate. A magnetic tunnel junction (MTJ) is on the backside between the first conductive line and the substrate, wherein one end of the MTJ is coupled through the substrate to the transistor and an opposite end of the MTJ is connected to the first conductive line, and wherein the transistor is further connected to the second conductive line on the front side.

20 Claims, 10 Drawing Sheets

(51) Int. Cl.
*H01L 43/12* (2006.01)
*H01L 43/06* (2006.01)

(56) References Cited

U.S. PATENT DOCUMENTS

| | | | |
|---|---|---|---|
| 2004/0206994 A1* | 10/2004 | Park | H01L 27/228 |
| | | | 257/295 |
| 2006/0062044 A1* | 3/2006 | Jeong | G11C 11/15 |
| | | | 365/158 |
| 2009/0161422 A1* | 6/2009 | Zhu | G11C 11/161 |
| | | | 365/171 |
| 2013/0051115 A1 | 2/2013 | En et al. | |
| 2015/0060967 A1 | 3/2015 | Yokoyama et al. | |
| 2015/0090952 A1 | 4/2015 | Huang | |
| 2017/0221541 A1* | 8/2017 | Jo | G11C 11/161 |
| 2017/0271578 A1 | 9/2017 | O'Brien et al. | |
| 2019/0304524 A1* | 10/2019 | Oguz | H01L 43/02 |
| 2021/0098691 A1* | 4/2021 | Yang | G11C 11/16 |

FOREIGN PATENT DOCUMENTS

| | | |
|---|---|---|
| WO | WO 2018/039645 | 3/2018 |
| WO | WO-2018063302 | 4/2018 |

OTHER PUBLICATIONS

Search Report for European Patent Application No. 19175812.7 dated Nov. 14, 2019, 14 pgs.

\* cited by examiner

MAGNETIC TUNNEL JUNCTION (MTJ) INTEGRATION ON BACKSIDE OF SILICON

TECHNICAL FIELD

Embodiments of the disclosure are in the field of integrated circuit structures and, in particular, magnetic tunnel junction (MTJ) integration on backside of silicon.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. The necessity to optimize the performance of each device becomes increasingly significant.

Non-volatile embedded memory, e.g., on-chip embedded memory with non-volatility can enable energy and computational efficiency. However, leading embedded memory options such as spin torque transfer magnetoresistive random access memory (STT-MRAM) can suffer from high voltage and high current-density problems during the programming (writing) of the cell. The density limitations of STT-MRAM may be due to large write switching current and select transistor requirements. Specifically, traditional STT-MRAM has a cell size limitation due to the drive transistor requirement to provide sufficient spin current. Furthermore, such memory is associated with large write current (>100 µA) and voltage (>0.7 V) requirements of conventional magnetic tunnel junction (MTJ) based devices. In particular, this is manifested as i) high write error rates or low speed switching (exceeding 20 ns) in magnetic tunnel junction (MTJ) based MRAM, and reliability issues due to tunneling current in magnetic tunnel junctions.

As such, significant improvements are still needed in the area of non-volatile memory arrays based on MTJs.

DESCRIPTION OF THE EMBODIMENTS

Figure 1:
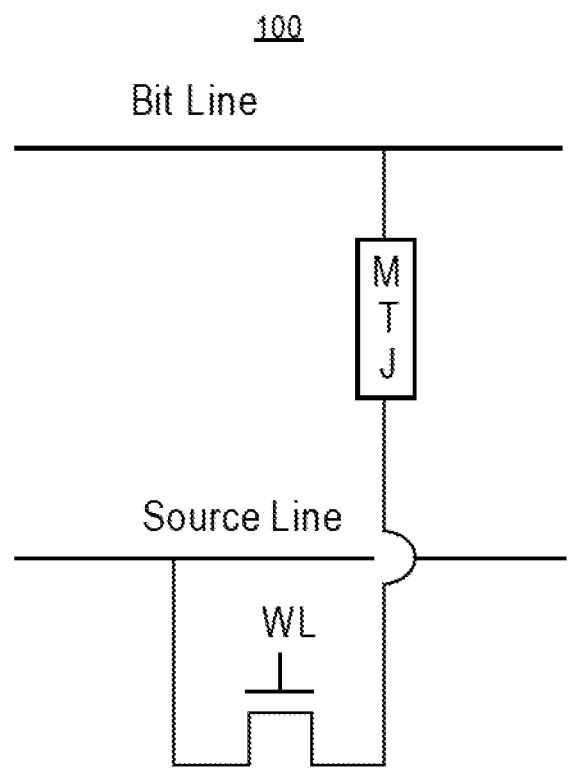
FIG. 1 illustrates a two terminal 1T-1MTJ (Magnetic Tunnel Junction) bit-cell for a STT-MRAM.

Embodiments for a filter layer for magnetic tunnel junction (MTJ) integration on backside of silicon are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the FIGS. are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or embodiments of the present invention is directed to magnetic tunnel junction (MTJ) integration on backside of silicon. General applications of such an array include, but are not limited to, embedded memory, magnetic tunnel junction architectures, MRAM, non-volatile memory, spin hall effects, spin torque memory, and embedded memory using magnetic memory devices.

More specifically, one or more embodiments a MTJ (Magnetic Tunnel Junction) MRAM (Magnetic Random Access Memory) with metallization on both side (MOBS) bit-cell is described. In one embodiment, the bit-cell is fabricated on both sides of a substrate having a front side and a backside, wherein a first conductive line is on the backside and a second conductive line is on the front side. A transistor is on the front side between the second conductive line and the substrate. A magnetic tunnel junction (MTJ) is on the backside between the first conductive line and the substrate, wherein one end of the MTJ is coupled through the substrate to the transistor and an opposite end of the MTJ is connected to the first conductive line, and wherein the transistor is further connected to the second conductive line on the front side. In one embodiment, the bit-cell is a 1T (one transistor)-1MTJ with metal on both side (MOBS) bit-cell. The embodiments also describe a layout of the 1T-1MTJ with MOBS bit-cell.

In order to provide context, FIG. 1 illustrates a two terminal 1T-1MTJ (Magnetic Tunnel Junction) bit-cell 100 for STT-MRAM. All components shown are on the same side of a substrate. The read and write current paths for bit-cell 100 are identical, resulting in many design trade-offs. For example, during read operation, higher resistance of MTJ device is desired than during write operation. However, same current paths for passing read and write currents discourages from having different resistances for read and write operations. To write a logical high to bit-cell 100, bit line is raised relative to source (or select) line, and to write a logical low to bit-cell 100, bit line is lowered relative to the source line. To read from bit-cell 100, source line is set to logical low and MTJ resistance is sensed using weak current (e.g., $\frac{1}{8}^{th}$ of write current).

The 1T-1MTJ bit-cell 100 may have large write current (e.g., greater than 100 µA) and large voltage (e.g., greater than 0.7 V) requirements of the MTJ. The 1T-1MTJ bit-cell 100 may have high write error rates or low speed switching (e.g., exceeding 20 ns) in MTJ based MRAM. The 1T-1MTJ bit-cell 100 may also have reliability issues due to tunneling current in magnetic tunnel junctions. For example, an insulator layer in the MTJ device is a barrier (e.g., 1 KΩ to 10 KΩ) which resists flow of large current, and lower current flow causes higher write errors.

Figure 2A:
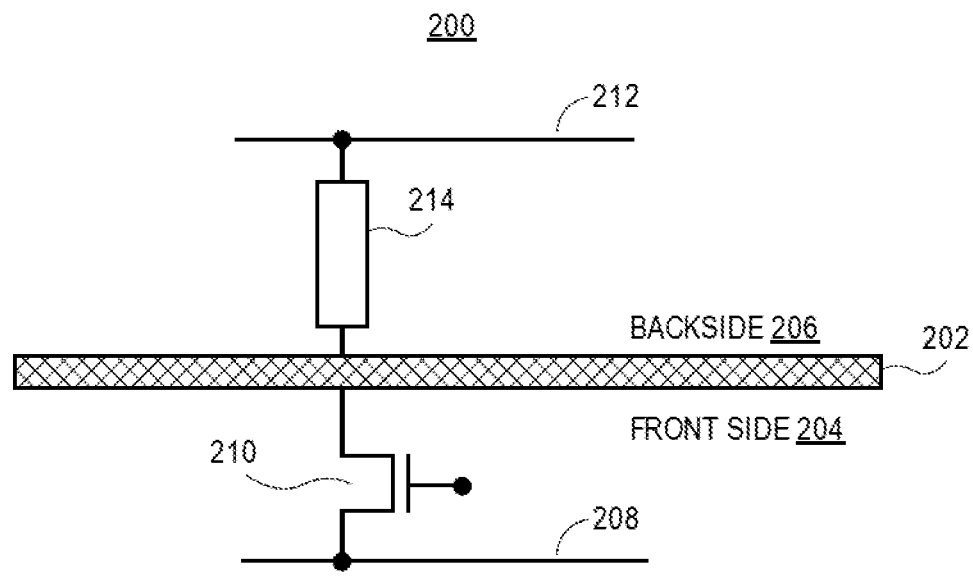
FIG. 2A illustrates an integrated circuit comprising a 1T-1MTJ MRAM bit-cell with MOBS, according to one embodiment of the disclosure.

According to one or more embodiments, an improved implementation for a MTJ (Magnetic Tunnel Junction) MRAM (Magnetic Random Access Memory) is provided, which is directed to a 1T-1MTJ MRAM bit-cell with metal on both side (MOBS), as shown in FIG. 2A.

FIG. 2A illustrates an integrated circuit comprising a 1T-1MTJ MRAM bit-cell 200 with MOBS, according to one embodiment of the disclosure. The bit-cell 200 comprises a substrate 202 having front side 204 of metallization and backside 206 of metallization, where a first conductive line 212, such as a bit line, is on the backside, and a second conductive line 208, such as a source line, is on the front side. A transistor 210 is located on the front side 204 between the second conductive line 208 and the substrate 202. A MTJ device 214 is on the backside 206 between the first conductive line 212 and the substrate 202, wherein one end of the MTJ device 214 is coupled through the substrate 202 to the transistor 210, and an opposite end of the MTJ device 214 is connected to the first conductive line 212 in the backside 206. On the front side, the transistor 210 is further connected to the second conductive line 208.

The 1T-1MTJ bit-cell 200 with MOBS provides a highly compact RAM via the Giant Spin Hall Effect (GSHE), which produces high spin injection efficiency. Some non-limiting technical effects of the embodiments are that low programming voltages (or higher current for identical voltages) are enabled by the GSHE; lower write error rates are realized to enable faster MRAM (e.g., less than 10 ns); write and read paths are decoupled to enable faster read latencies; and low resistance write operation is realized which allows for injection or higher currents to obtain ultra-fast switching behavior of the MTJ.

Figure 2B:
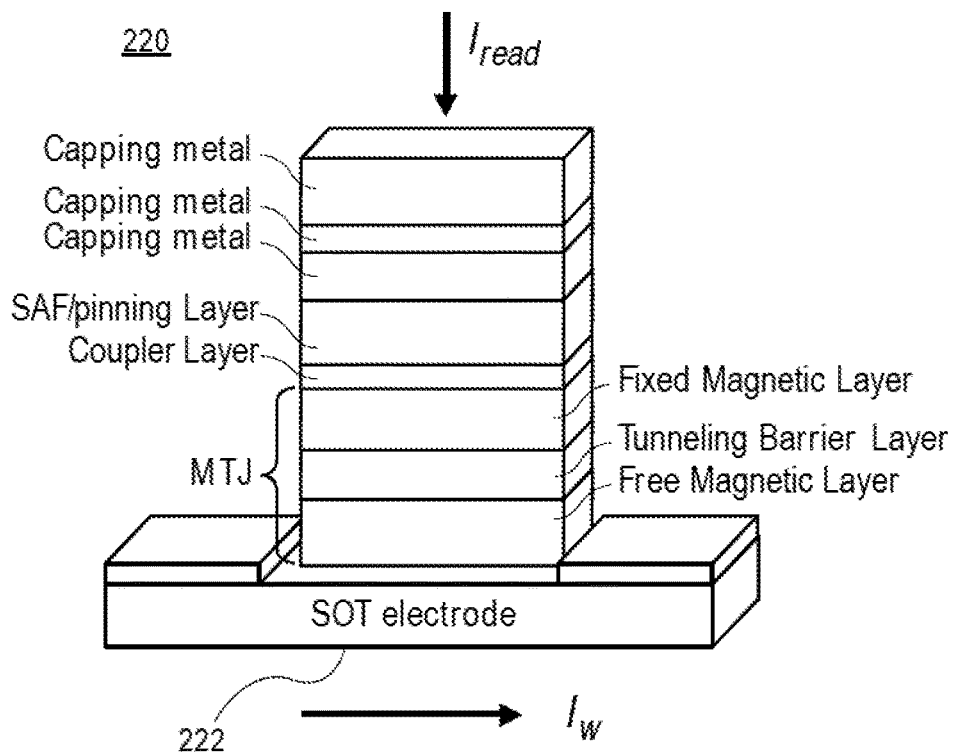
FIG. 2B illustrates a typical material stack for GSHE Spin Orbit Torque (SOT) Switching based 1T-1MTJ bit cell, according to one embodiment of the disclosure.

FIG. 2B illustrates a typical material stack 220 for GSHE Spin Orbit Torque (SOT) Switching based 1T-1MTJ bit-cell 200, according to one embodiment of the disclosure. The example MTJ stack comprises free magnetic layer (FM1), tunneling barrier, fixed magnetic layer (FM2), coupler layer, Synthetic Antiferro-magnet (SAF)/pinning layer, and a top electrode comprising three capping metal layers.

The MTJ functions essentially as a resistor, where the resistance of an electrical path through the MTJ may exist in two resistive states, either "high" or "low," depending on the direction or orientation of magnetization in the free magnetic layer and in the fixed magnetic layer. In the case that the directions of magnetization in the free magnetic layer and the fixed magnet layer closest to it are substantially opposed or anti-parallel with one another, a high resistive state exists. In the case that the directions of magnetization in the coupled free magnetic layers and the fixed magnetic layer closest to it are substantially aligned or parallel with one another, a low resistive state exists. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

In certain aspects and in at least some embodiments of the present invention, certain terms hold certain definable meanings. For example, the "free" layer magnetic layer is a magnetic layer storing a computational variable. A "fixed" magnetic layer is a magnetic layer with fixed magnetization (magnetically harder than the free magnetic layer). The free layer and the fixed layer may be ferromagnetic layers. In one embodiment, the free layer may be complex and made of two separate magnetic layers with a coupler layer in between. In one embodiment, the fixed layer is complex and made of two magnets with a coupler layer in between. In yet another embodiment, both the free layer and the fixed layer may be complex. A tunneling barrier material is one located between free and fixed magnetic layers. The SAF/pinning layer allows for cancelling the dipole fields around the free magnetic layer. A coupler layer aids the SAF/pinning layer in pinning the fixed layer, and centers the magnetic hysteresis loop by overcoming the dipole field between the fixed and the free magnetic layers. In one embodiment, the coupler layer may comprise Ru, Ir, W, or Ta.

A wide combination of materials can be used for material stacking of the 1T-1MTJ bit-cell 200. For example, in one embodiment, the free magnetic layer and the fixed magnetic layer may comprise $Co_xFe_yB_z$ (Cobalt, Iron, Boron), where 'x,' 'y,' and 'z' are integers. The tunneling barrier layer may comprise an oxide layer such as magnesium oxide (MgO). The free magnetic layer is in direct contact with a SOT electrode 222, which may comprise a GSHE metal or heavy metal dopants made of heavy metals with high spin-orbit coupling, such as β-Tantalum (β-Ta), β-Tungsten (β-W), Pt, Hf, Ir, Bi, and Cu doped with elements such as Iridum, bisumuth, and/or any of the elements of 3d, 4d, 5d and 4f, 5f periodic groups in the periodic table. In another embodiment, the SOT electrode 222 and optionally the SAF/pinning layer may comprise Co/antiferro-magnet, Fe/antiferro-magnet, Ni/antiferro-magnet, MnGa/antiferro-magnet, MnGeGa/antiferro-magnet, Bct-Ru/antiferro-magnet, and alloys thereof. In yet another embodiment, the SOT electrode 222 and optionally the SAF/pinning layer may comprise quasi-two-dimensional triangular antiferro-magnets including Ni1-xMxGa2S4 where M=Mn, Fe, Co and Zn and transition metal di-chalcogenides/topological insulators such as BiSe2, WTe2, WSe2, MoSe2 and the like, IrMn, PtMn, NiMn or other triangular, Kagomi, chiral or hexagonal antiferro-magnets and in their single crystal form or their amorphous alloys in various compositions. In one embodiment, the SOT electrode 222 transitions into a normal high conductivity metal (e.g., Cu) to minimize the SOT electrode resistance. In alternative embodiments, other materials may be used to form the 1T-1MTJ bit-cell 200.

Figure 2C:
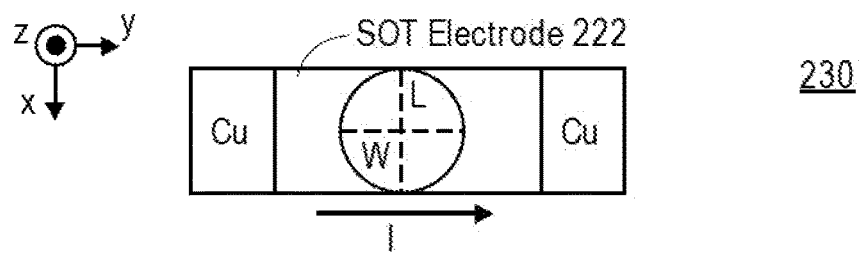
FIG. 2C is a top view of the device of FIG. 2B.

FIG. 2C is a top view 230 of the device of FIG. 2B. In FIG. 2C, the magnet is oriented along the width of the SOT electrode 222 for appropriate spin injection. The magnetic cell is written by applying a charge current via the SOT electrode 222. The direction of the magnetic writing is decided by the direction of the applied charge current. Positive currents (along+y) produce a spin injection current with transport direction (along+z) and spins pointing to (+x) direction. SOT can impact both perpendicular and in plane magnetic free layers, this disclosure applies to both. Because what is known as the Spin Hall Effect may be responsible for the current-induced magnetization switch in the MTJ device, an SOT-MRAM may also be referred to as a Giant Spin Hall Effect (GSPHE) MRAM.

Figure 2D:
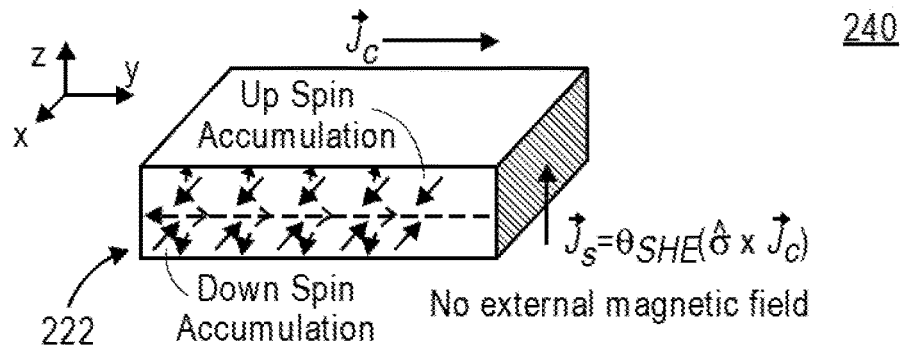
FIG. 2D is a cross-section of the SOT electrode that shows direction of spin currents and charge currents as decided by SOT in metals.

FIG. 2D is a cross-section of the SOT electrode 222 that shows direction of spin currents and charge currents as decided by SOT in metals. The injected spin current in-turn produces spin torque to align the magnet in the +x or –x direction. The transverse spin current ($\vec{I}_s = \vec{I}_\uparrow - \vec{I}_\downarrow$ with spin direction $\hat{\sigma}$) for a charge current ($\vec{I}_c$) in the SOT electrode 222 is given by equation (1):

$$I_s^\rho P_{she}(W, t, \lambda_{sf}, \phi_{SHE})(\sigma \times I_s^\rho) \quad (1)$$

where $P_{SHE} = (\vec{I}_\uparrow - \vec{I}_\downarrow)/(\vec{I}_\uparrow + \vec{I}_\downarrow)$ is the spin hall injection efficiency which is the ratio of magnitude of transverse spin current to lateral charge current, w is the width of the magnet, t is the thickness of the GSHE metal electrode, λsf is the spin flip length in the GSHE metal, θGSHE is the spin hall angle for the GSHE-metal to FM1 interface. The injected spin angular momentum responsible for spin torque is given by $\vec{S} = \hbar \vec{I}_s/2e$.

Figure 3:
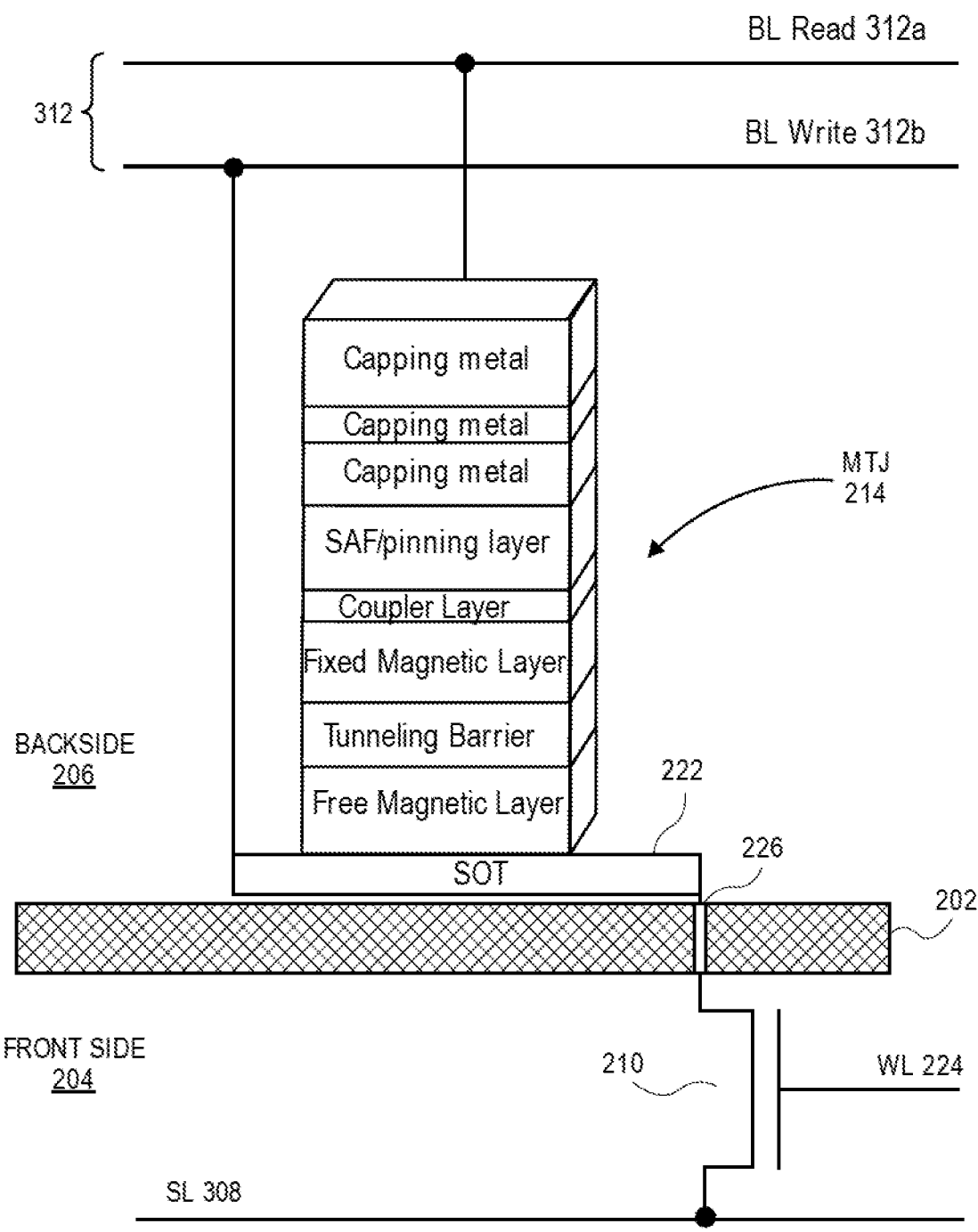
FIG. 3 illustrates a memory device comprising a 1T-1MTJ MRAM bit-cell with MOBS in further detail according to one embodiment of the disclosure.

FIG. 3 illustrates a memory device comprising a 1T-1MTJ MRAM bit-cell 300 with MOBS in further detail according to one embodiment of the disclosure, where like components from FIG. 2A have like reference numbers, but are not limited to such. The MRAM bit-cell 300 is fabricated on both the front side 204 and the backside 206 of substrate 202 and is configured as a three terminal device compared to the two terminal bit-cell 100. The backside 206 comprises a bit line 312 and a MTJ device 214, where a read bit line 312a and a write bit line 312b of bit line 312 are decoupled from one another forming the first and second terminals. The front side 204 comprises a source line 308, which forms the third terminal, and a transistor 210, which is controllable by a word line (WL) 224 and is coupled to the source line.

According to the disclosed embodiments, the MTJ device 214 on the backside 206 includes a SOT electrode 222 comprising a SHE material and a free magnetic layer (e.g., CoFeB) in direct contact with the SOT electrode 222, wherein the SOT electrode 222 defines one end of the MTJ device 214 and is directly coupled to the write bit line 312b; and a top electrode defines an opposite end of the MTJ device 214 and is coupled to the read bit line 312a. In one embodiment, SOT electrode 222 is exclusive to the MTJ device, i.e., it is not shared with other MTJ devices.

In one embodiment, one of drain/source terminals of the transistor 210 on the front side 204 is coupled through a via 226 in the substrate 202 to the SOT electrode 222 on the backside 206, and another of the source/drain terminals is coupled to the source line 308 on the front side 204. In one embodiment, word line 224 is coupled to the gate terminal of transistor 210. In one embodiment, transistor 210 is an n-type transistor e.g., NMOS, or a p-type transistor e.g., PMOS. In one embodiment, transistor 210 may be placed in saturation mode to overcome the existing limitation in highly scaled MRAM arrays In one embodiment, to write data to bit-cell 200, spin current is injected in the free magnetic layer of the MTJ device which is in direct contact with the SOT electrode 222 formed from SHE material. In one embodiment, to read data from bit-cell 200, a sense amplifier (not shown) senses read bit line 312a and write bit line 312b.

There are several advantages of bit-cell 200 over bit-cell 100. For example, the write and read operation of the bit-cell 200 are decoupled from one another allowing for highly optimized write operation, e.g., less than 10 ns with very low BER (bit error rate). Other advantages include, for example, the read path resistance can now be optimized for read sense amplifier requirements; feasibility to achieve spin injection efficiency of approximately 100% or higher due to Spin Hall Enhancement; the same density compared to density of existing 1T-1MTJ designs.

Figure 4:
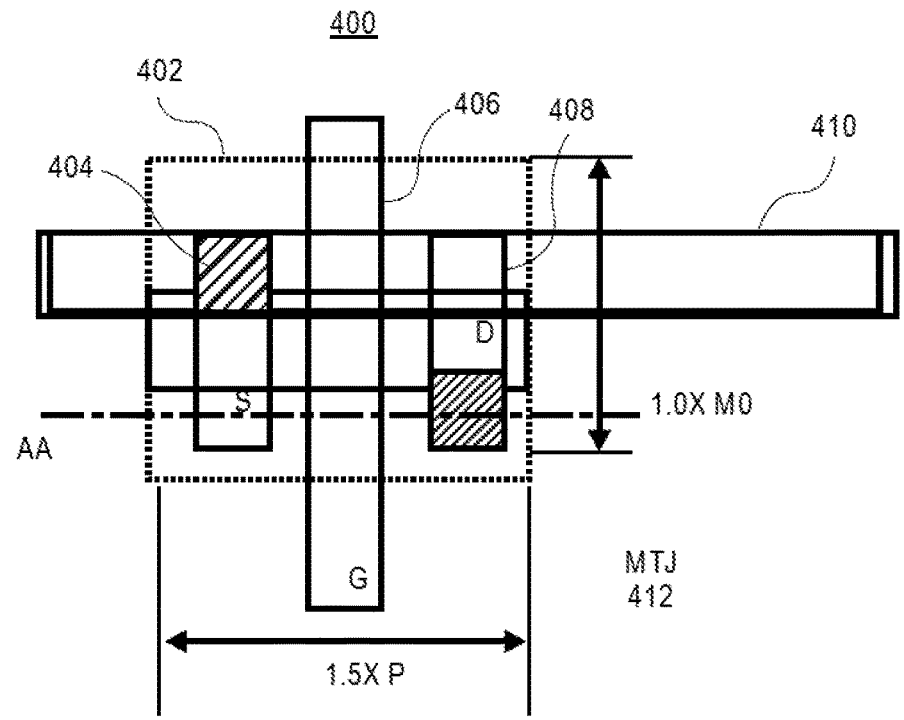
FIG. 4 is a top view of a layout of a cross sectional view of a 1T-1MTJ MRAM bit-cell with MOBS, according to one embodiment of the disclosure.

FIG. 4 is a top view of a layout of a cross sectional view of a 1T-1MTJ MRAM bit-cell with MOBS, according to one embodiment of the disclosure. The bit-cell layout 400 shows a transistor area 402 comprising source 404, gate 406, and drain 408. A source line 410 extends over the transistor area 402, and MTJ 412 lies under a portion of the drain 408. As shown, the 1T-1MTJ bit-cell layout 400 has a 1.5× transistor pitch and a 1.0× metal 0 (M0) pitch. The 1.5 P, 1.0 M0 layout is 33% denser than a 1.5 P, 1.5 M0 layout of a conventional 1T-1R layout. Another advantage of the bit-cell layout 400 is that the layout allows for high temperature processing for the MTJ stack, since the MTJ stack is on a different side of the substrate from the logic.

Figure 5:
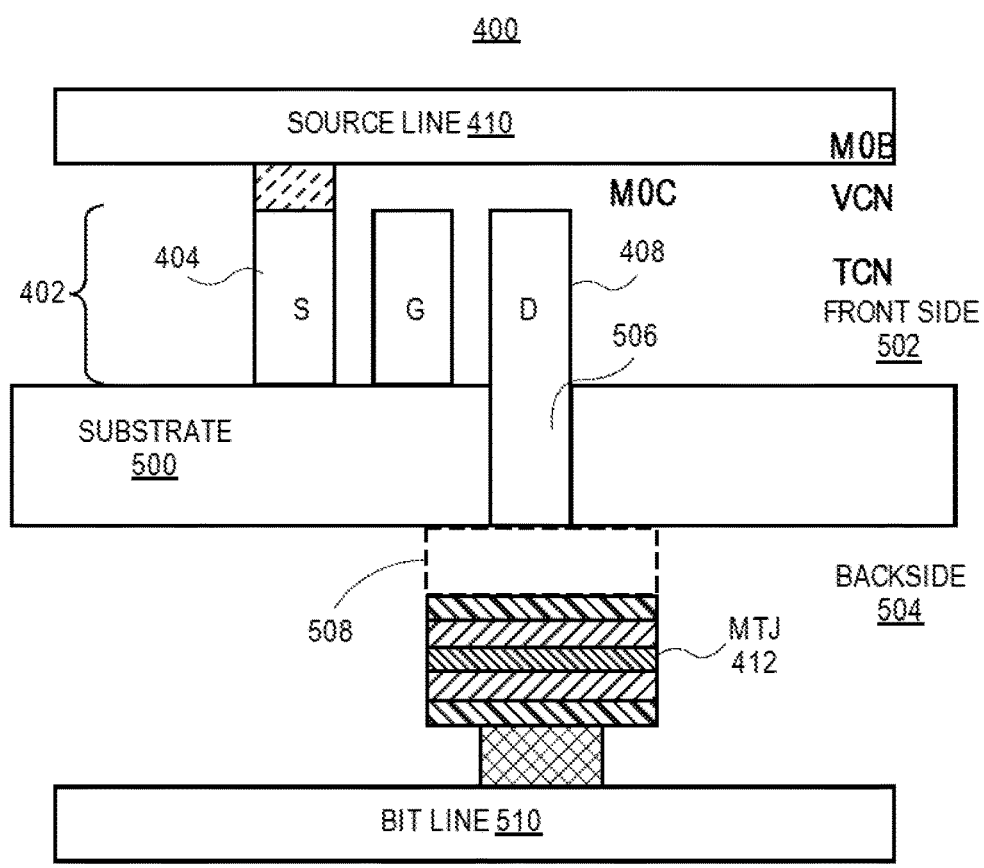
FIG. 5 is a cross sectional view of 1T-1MTJ MRAM bit-cell with MOBS along line cross sectional line AA of FIG. 4.

FIG. 5 is a cross sectional view of 1T-1MTJ MRAM bit-cell with MOBS along line cross sectional line AA of FIG. 4, where like components of FIG. 4 have like reference numerals. The cross-section view of the bit-cell layout 400 shows the transistor area 402 fabricated on a front side 502 of substrate 500, and the MTJ 412 fabricated on a backside 504 of the substrate 500. In one embodiment, the source 404 and drain 408 of the transistor are coupled to metal layers TCN and in turn couple to M0C and M0B lines respectively, where M0C and M0B are segments of metal in M0 layer. In one embodiment, M0C is a continuous line for a row of bit-cells in an array. In one embodiment, source line is coupled to M0C. The drain 408 is coupled to MTJ 412 on the backside 504 using a through via 506 in substrate 500. The through via 506 is connected to a via pedestal 508 that is in contact with one end of MTJ 412. An opposite end of MTJ 412 is coupled to bit line 510.

Figure 6:
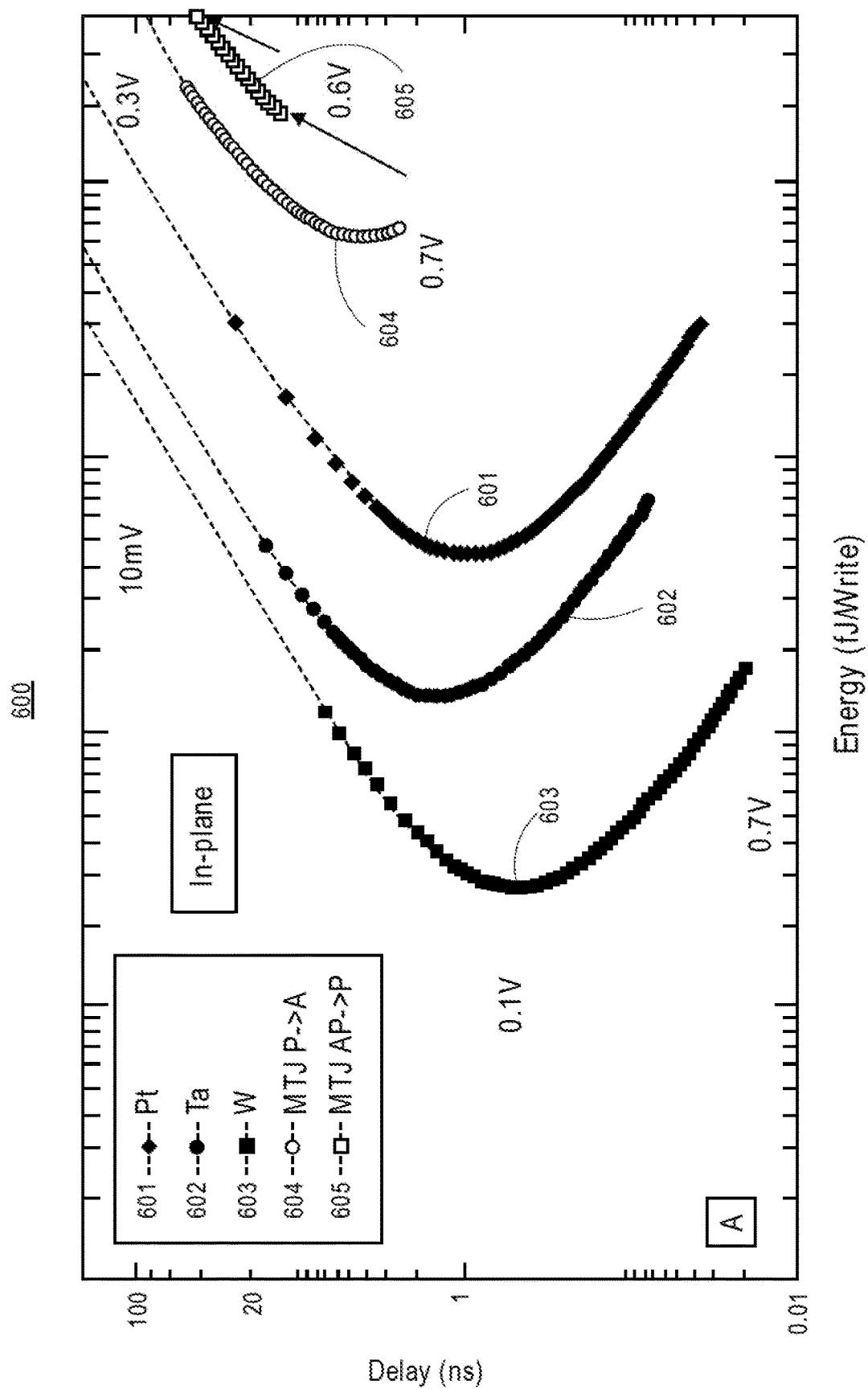
FIG. 6 is a plot of write energy-delay conditions for 1T-1MTJ MRAM bit-cell compared to traditional MTJs, according to one embodiment.

FIG. 6 is a plot 600 of write energy-delay conditions for 1T-1MTJ MRAM bit-cell compared to traditional MTJs, according to one embodiment. The x-axis is energy (fJ/Write) and y-axis is delay in nano-seconds. Plot 700 shows five waveforms. Plot 700 compares the energy-delay trajectory of GSHE and MTJ (GSHE-MTJ) devices for in-plane magnet switching as the applied write voltage is varied. The energy-delay trajectory (for in-plane switching) can be written as:

$$E(\tau) = R_{write} I_{co}^2 \frac{\left(\tau + \tau_o \ln\left(\frac{\pi}{2\theta_0}\right)\right)^2}{\tau} = \frac{4}{\eta^2} \frac{R_{write}}{P^2} \frac{1}{\tau}\left(\mu_0 e \alpha M_s V \frac{M_s}{2}\left(\tau + \tau_o \ln\left(\frac{\pi}{2\theta_0}\right)\right)\right)^2$$

where $R_{write}$ is the write resistance of the devices (RGSHE or RMTJ-P, RMTJ-AP), 'P' is the spin current polarization (PGSHE or PMTJ), $\mu_0$ is vacuum permeability, and 'e' is the electron charge. The energy at a given delay is directly proportional to the square of the Gilbert damping. $\tau_0 = M_s V e / I_c P \mu_B$ varies as the spin polarization varies for various GSHE metal electrodes. The combined effect of spin Hall polarization, damping and resistivity of the spin Hall electrodes is plotted in plot 600.

All the cases considered in plot 600 assume a 30×60 nm magnet with 40 kT thermal energy barrier and 3.5 nm GSHE electrode thicknesses. The energy-delay trajectories of the devices are obtained assuming a voltage sweep from 0-0.7 V in accordance to voltage restrictions of scaled CMOS. The energy-delay trajectory of the GSHE-MTJ devices exhibits broadly two operating regions. Region 1 where the energy delay product is approximately constant, which is expressed as:

$$(\tau_d < M_s V e / I_c P \mu_B) \quad (4)$$

Region 2 where the energy is proportional to the delay, which is expressed as:

$$\tau_d > M_s V e / I_c P \mu_B \quad (5)$$

The two regions are separated by energy minima at:

$$\tau_{opt} = M_s V e / I_c P \mu_B \quad (6)$$

where minimum switching energy is obtained for the spin torque devices.

The energy-delay trajectory of the STT-MTJ devices (plots 604 and 605) is limited with a minimum delay of 1 ns for in-plane devices at 0.7 V maximum applied voltage, the switching energy for P-AP and AP-P are in the range of 1 pJ/write. In contrast, the energy-delay trajectory of GSHE-MTJ (in-plane anisotropy) devices 701, 702, and 703 can enable switching times as low as 20 ps (β-W with 0.7 V, 20 fJ/bit) or switching energy as small as 2 fJ (β-W with 0.1 V, 1.5 ns switching time). Plot 700 shows that 1T-1 SHE MTJ device with same energy exhibits lower write operation delay.

Figure 7:
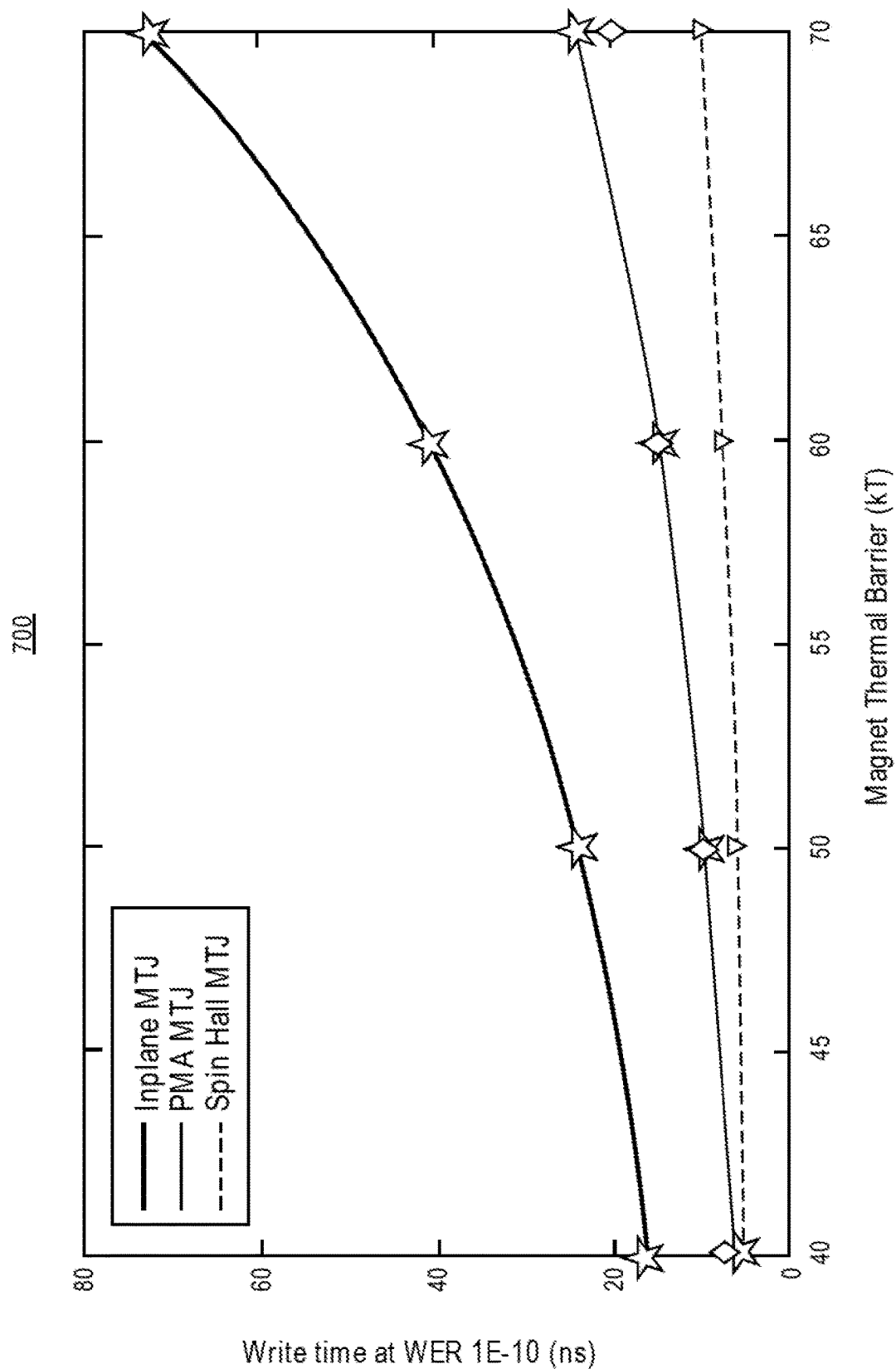
FIG. 7 is a plot of reliable write times for 1T-1MTJ MRAM bit-cell with MOBS and traditional MTJs, according to one embodiment.

FIG. 7 is a plot 700 of reliable write times for 1T-1MTJ MRAM bit-cell with MOBS and traditional MTJs, according to one embodiment. Plot 00 shows write times of the 1T-1 SHE MTJ devices using bit-cell circuit simulations coupled with Landau-Lifshitz-Gilbert nanomagnet dynamics. The Spin Hall MTJ shows significant write time improvement compared to perpendicular and in-plane MTJs.

Figure 8:
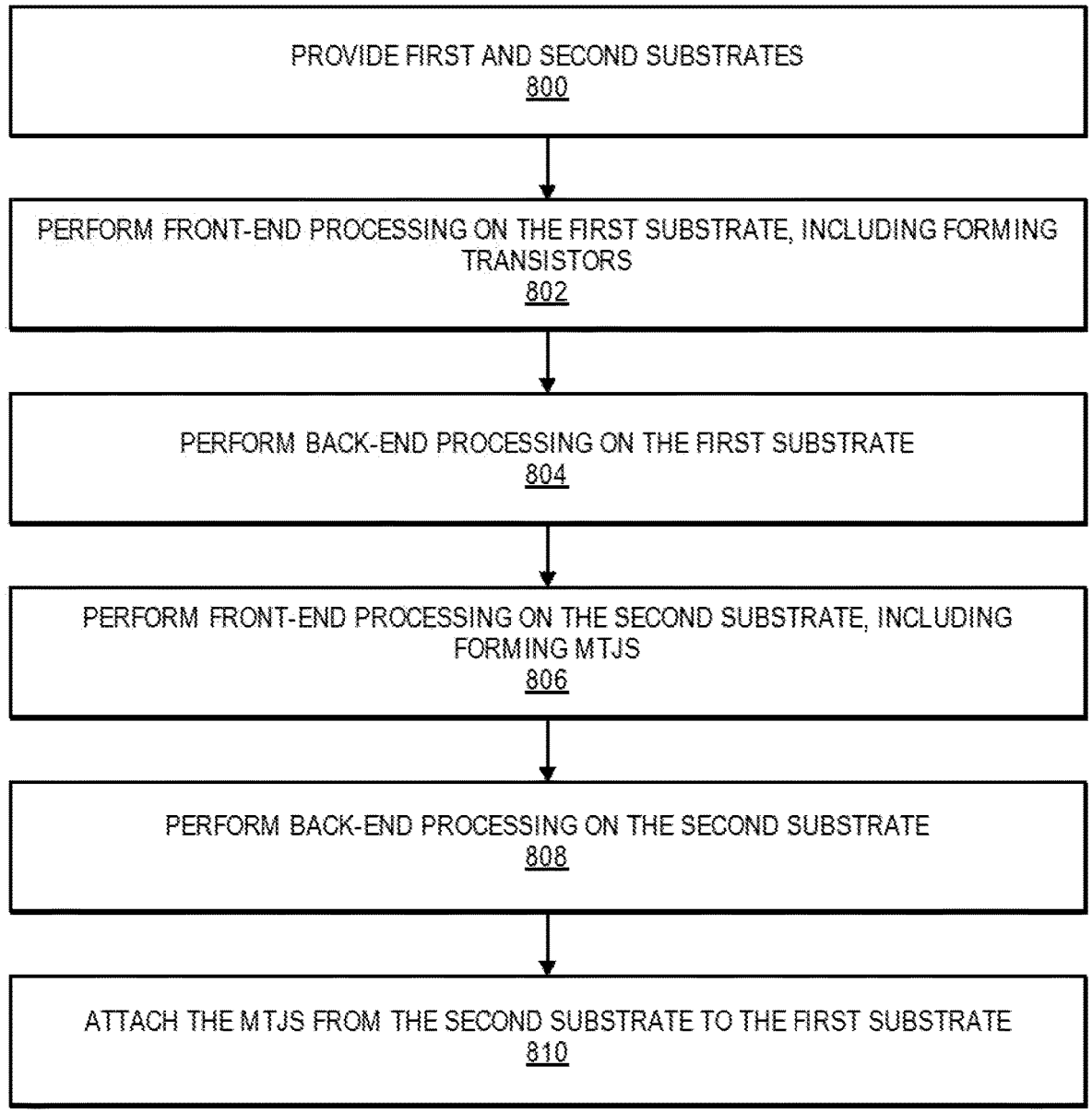
FIG. 8 is a flow diagram representing various operations in a method of fabricating a 1T-1MTJ memory device with MOBS in accordance with the embodiments disclosed herein.

FIG. 8 is a flow diagram representing various operations in a method of fabricating a 1T-1MTJ memory device with MOBS in accordance with the embodiments disclosed herein. As previously described, fabrication techniques of a 1T-1MTJ memory device are implemented within the context of a MOBS scheme. In some such embodiments, the MOBS scheme may be achieved by forming first and second multilayered substrates, including bulk wafers (e.g., a bulk silicon) or a semiconductor-on-insulator wafers (e.g., silicon-on-insulator or SOI wafer) (block 800).

Standard front-end processing can then be performed on the first substrate to form as many semiconductor devices (e.g., transistors) as desired (block 802).

Standard back-end processing can then be performed over the transistors to form contacts and as many metal (or otherwise electrically conductive) back-end layers as desired on the first substrate (block 804). In some embodiments, front side vias or contacts may be processed very deep, such as into at least a portion of the substrate below the device layer, as the deeply processed vias may be used for making contact through wafer between drains of the transistor and the MTJ.

Standard front-end processing can then be performed on the second substrate to form as many semiconductor devices (e.g., MTJs) as desired (block 806). In an embodiment, the SOT electrodes of the MTJs are formed in a dielectric layer by a damascene or a dual damascene process that is well known in the art. In an embodiment, the SOT electrode may comprises a Giant Spin Hall Effect (GSHE) metal made of β-Tantalum (β-Ta), β-Tungsten (β-W), Pt, Copper (Cu) doped with elements such as Iridum, Bismuth and any of the elements of 3d, 4d, 5d and 4f, 5f periodic groups in the periodic table.

In one embodiment, a MTJ material stack is formed on the SOT electrode. In one embodiment, the MTJ material stack and the material layer stack are blanket deposited. The layers of the MTJ stack may be formed by sputter-deposition techniques with deposition rates in the Ångstrom-per-second range. The techniques include physical vapor deposition (PVD), specifically planar magnetron sputtering, and ion-beam deposition. In an embodiment, the MTJ stack may be subjected to an annealing process performed at a temperature between 300-400 degrees Celsius. In an embodiment, layers of the material layer stack may be respectively blanket deposited by an evaporation process, an atomic layer deposition (ALD) process or by chemical vapor deposition (CVD) process. In an embodiment, the chemical vapor deposition process is enhanced by plasma techniques such as RF glow discharge (plasma enhanced CVD) to increase the density and uniformity of the film. In an embodiment, an uppermost layer of material layer stack may include the top electrode layer that ultimately acts as a hardmask.

The deposition process can be configured to control the magnetic properties of the magnetic layers. For example, the direction of the magnetic anisotropy of the ferromagnetic materials can be set during the deposition of the layer by applying a magnetic field across the substrate. The resulting uniaxial anisotropy is observed as magnetic easy and hard directions in the magnetization of the layer. Since the anisotropy axis affects the switching behavior of the material, the deposition system must be capable of projecting a uniform magnetic field across the substrate, typically in the 20-100 Oe range, during deposition. The deposition process can control other magnetic properties, such as coercivity and magnetorestriction, by the choice of magnetic alloy and deposition conditions. Because the switching field of a patterned bit depends directly on the thickness of the free layer magnet, the thickness uniformity and repeatability must meet strict requirements.

Standard back-end processing can then be performed over the MTJs to form contacts and as many metal (or otherwise electrically conductive) back-end layers as desired on the second substrate (block 808). For example, the bit lines may be patterned on an uppermost surface of the top electrode of the MTJs to complete formation of a memory cell. In an embodiment, the bit lines may comprise conductive material such as W, TiN, TaN or Ru. In an embodiment, the bit line is formed by using a dual damascene process (not shown) and includes a barrier layer such as Ru, Ta or Ti and a fill metal such as W or Cu.

The MTJs from the second substrate are then attached to the first substrate (block 810). In one example process flow, this may be accomplished as follows. MTJ stacks are formed over a transfer layer on the second substrate. Thereafter, a temporary substrate is formed on the top of the second substrate. The second substrate is then separated from the MTJ stacks at the transfer layer. The MTJ stacks with the temporary substrate thereon are then attached to the first substrate having a device layer formed thereon including the transistors. The transfer layer of the temporary wafer is then removed, for example by, etching.

In one embodiment, the MTJs from the second substrate may be attached to the first substrate prior to backend processing (block 808). In another embodiment, the MTJs may be fabricated on the first substrate and the transistors fabricated on the second substrate. In an embodiment, where the substrates are wafers, respective die from the first and second wafers may be bonded together. The die may be bonded using any suitable wafer bonding process known to those of ordinary skill.

The transistor in each 1T-1MTJ bit-cell with MOBS is connected with a word line and a source line in a manner that will be understood to those skilled in the art. The 1T-1MTJ bit-cell with MOBS may further include additional read and write circuitry (not shown), a sense amplifier (not shown), a bit line reference (not shown), and the like, as will be understood by those skilled in the art, for the operation of the 1T-1MTJ bit-cell with MOBS. It is to be understood that a plurality of the 1T-1MTJ bit-cell with MOBS may be operably connected to one another to form a memory array (not shown), wherein the memory array can be incorporated into a non-volatile memory device.

Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers. For example, in one embodiment, an embedded non-volatile memory structure is formed on a material composed of a dielectric material such as, but not limited to, silicon dioxide, silicon oxy-nitride, silicon nitride, or carbon-doped silicon nitride.

Figure 9B:
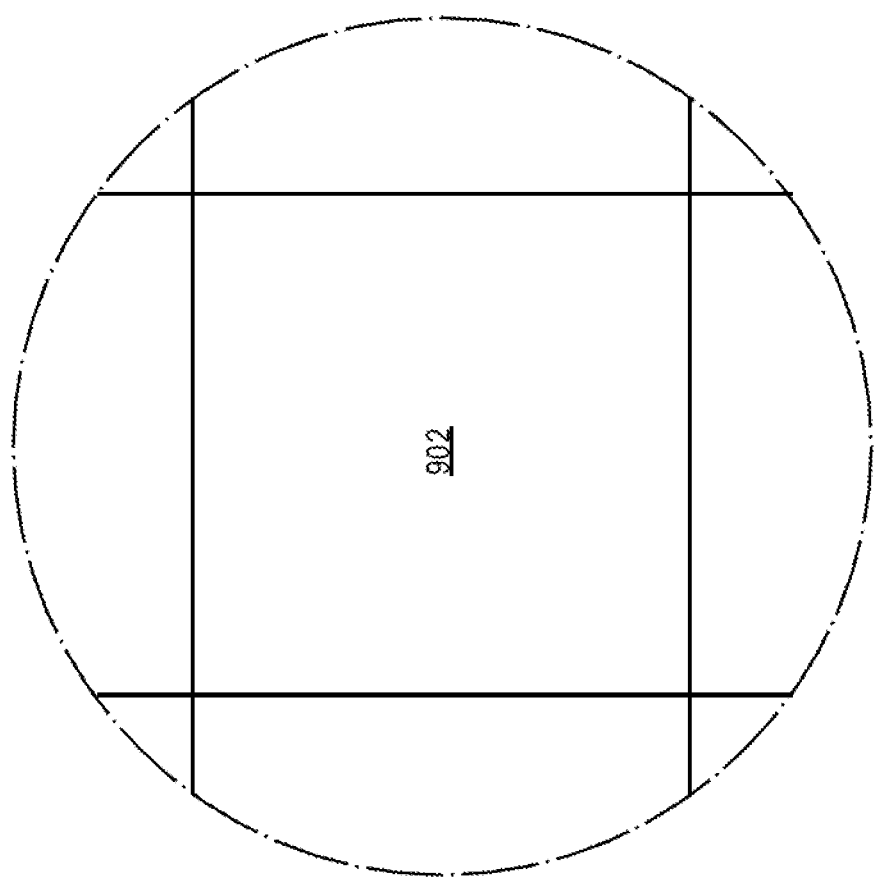
FIGS. 9A and 9B illustrate a wafer composed of semiconductor material and that includes one or more dies having integrated circuit (IC) structures formed on a surface of the wafer.
Figure 9A:
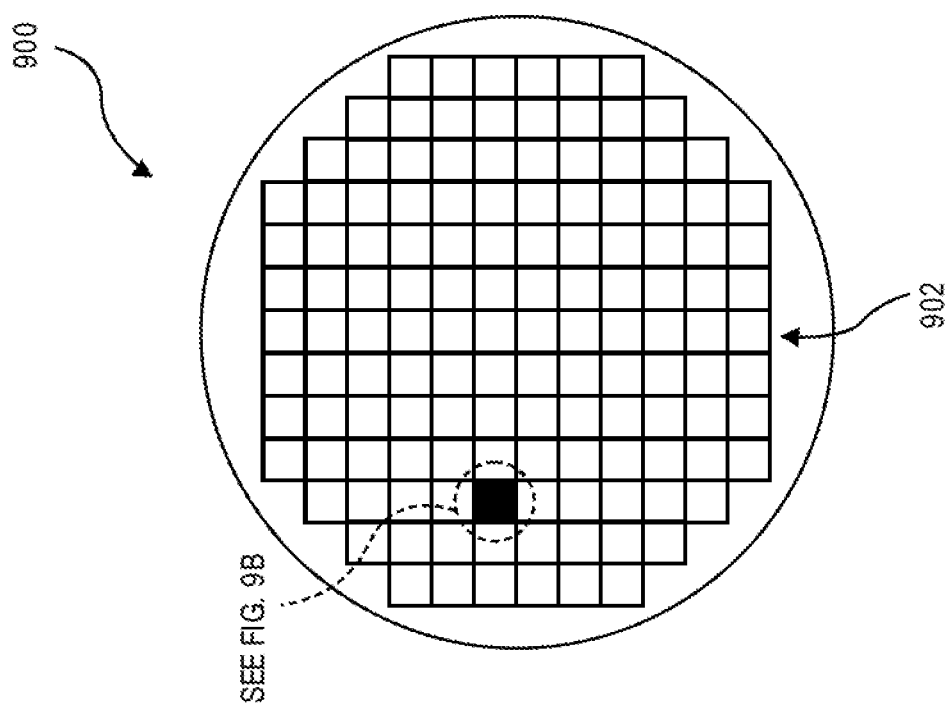

Referring to FIGS. 9A and 9B, a wafer 900 may be composed of semiconductor material and may include one or more dies 902 having integrated circuit (IC) structures formed on a surface of the wafer 900. Each of the dies 902 may be a repeating unit of a semiconductor product that includes any suitable IC (e.g., ICs including one or more embedded non-volatile memory structures having a 1T-1MTJ with MOBS memory device, such as described above. After the fabrication of the semiconductor product is complete, the wafer 900 may undergo a singulation process in which each of the dies 902 is separated from one another to provide discrete "chips" of the semiconductor product. In particular, structures that include embedded non-volatile memory structures having a 1T-1MTJ with MOBS memory device as disclosed herein may take the form of the wafer 900 (e.g., not singulated) or the form of the die 902 (e.g., singulated). The die 902 may include one or more embedded non-volatile memory structures having a 1T-1MTJ with MOBS memory device and/or supporting circuitry to route electrical signals, as well as any other IC components. In some embodiments, the wafer 900 or the die 902 may include an additional memory device (e.g., a static random access memory (SRAM) device), a logic device (e.g., an AND, OR, NAND, or NOR gate), or any other suitable circuit element. Multiple ones of these devices may be combined on a single die 902. For example, a memory array formed by multiple memory devices may be formed on a same die 902 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
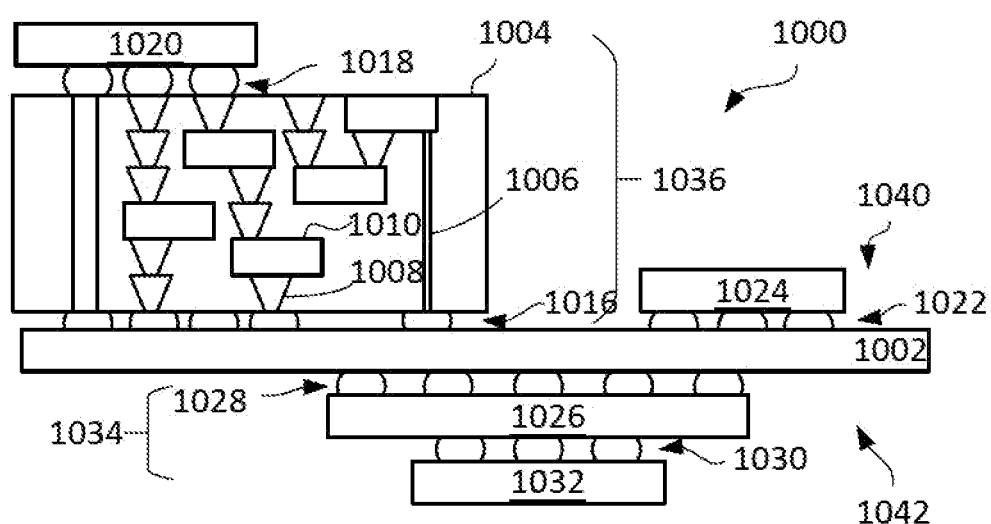
FIG. 10 is a cross-sectional side view of an integrated circuit (IC) device assembly that may include one or more embedded non-volatile memory structures having a 1T-1MTJ with MOBS memory device.

FIG. 10 is a cross-sectional side view of an integrated circuit (IC) device assembly that may include one or more embedded non-volatile memory structures having a 1T-1MTJ with MOBS memory device, in accordance with one or more of the embodiments disclosed herein.

Referring to FIG. 10, an IC device assembly 1000 includes components having one or more integrated circuit structures described herein. The IC device assembly 1000 includes a number of components disposed on a circuit board 1002 (which may be, e.g., a motherboard). The IC device assembly 1000 includes components disposed on a first face 1040 of the circuit board 1002 and an opposing second face 1042 of the circuit board 1002. Generally, components may be disposed on one or both faces 1040 and 1042. In particular, any suitable ones of the components of the IC device assembly 1000 may include embedded non-volatile memory structures having a 1T-1MTJ with MOBS memory device, such as disclosed herein.

In some embodiments, the circuit board 1002 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate.

The IC device assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 8), male and female portions of a socket, an adhesive, an underfill material, and/or any other suitable electrical and/or mechanical coupling structure.

The package-on-interposer structure 1036 may include an IC package 1020 coupled to an interposer 1004 by coupling components 1018. The coupling components 1018 may take any suitable form for the application, such as the forms discussed above with reference to the coupling components 1016. Although a single IC package 1020 is shown in FIG. 10, multiple IC packages may be coupled to the interposer 1004. It is to be appreciated that additional interposers may be coupled to the interposer 1004. The interposer 1004 may provide an intervening substrate used to bridge the circuit board 1002 and the IC package 1020. The IC package 1020 may be or include, for example, a die (the die 902 of FIG. 9B), or any other suitable component. Generally, the interposer 1004 may spread a connection to a wider pitch or reroute a connection to a different connection. For example, the interposer 1004 may couple the IC package 1020 (e.g., a die) to a ball grid array (BGA) of the coupling components 1016 for coupling to the circuit board 1002. In the embodiment illustrated in FIG. 10, the IC package 1020 and the circuit board 1002 are attached to opposing sides of the interposer 1004. In other embodiments, the IC package 1020 and the circuit board 1002 may be attached to a same side of the interposer 1004. In some embodiments, three or more components may be interconnected by way of the interposer 1004.

The interposer 1004 may be formed of an epoxy resin, a fiberglass-reinforced epoxy resin, a ceramic material, or a polymer material such as polyimide. In some implementations, the interposer 1004 may be formed of alternate rigid or flexible materials that may include the same materials described above for use in a semiconductor substrate, such as silicon, germanium, and other group III-V and group IV materials. The interposer 1004 may include metal interconnects 1010 and vias 1008, including but not limited to through-silicon vias (TSVs) 1006. The interposer 1004 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art.

The IC device assembly 1000 may include an IC package 1024 coupled to the first face 1040 of the circuit board 1002 by coupling components 1022. The coupling components 1022 may take the form of any of the embodiments discussed above with reference to the coupling components 1016, and the IC package 1024 may take the form of any of the embodiments discussed above with reference to the IC package 1020.

The IC device assembly 1000 illustrated in FIG. 10 includes a package-on-package structure 1034 coupled to the second face 1042 of the circuit board 1002 by coupling components 1028. The package-on-package structure 1034 may include an IC package 1026 and an IC package 1032 coupled together by coupling components 1030 such that the IC package 1026 is disposed between the circuit board 1002 and the IC package 1032. The coupling components 1028 and 1030 may take the form of any of the embodiments of the coupling components 1016 discussed above, and the IC packages 1026 and 1032 may take the form of any of the embodiments of the IC package 1020 discussed above. The package-on-package structure 1034 may be configured in accordance with any of the package-on-package structures known in the art.

Figure 11:
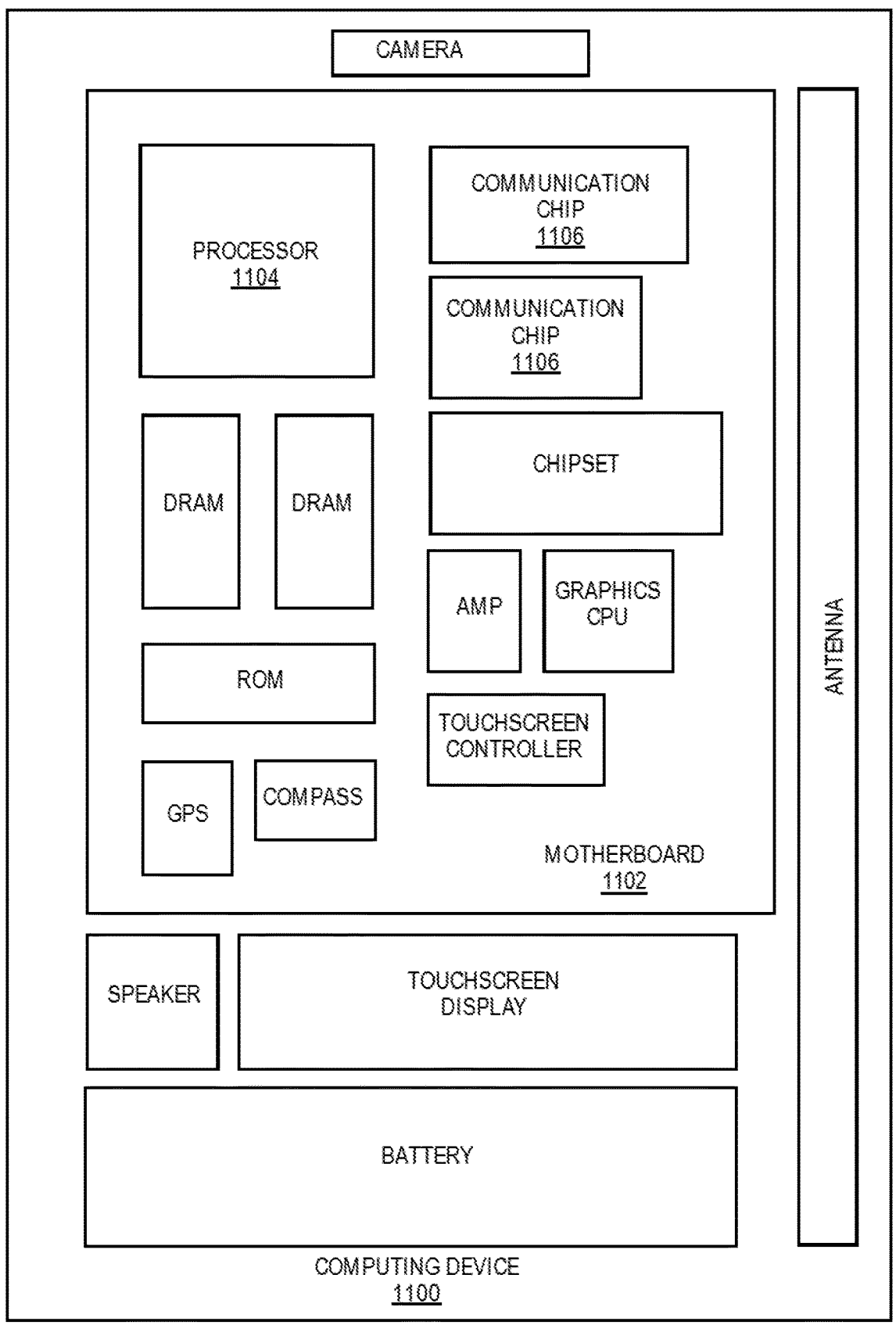
FIG. 11 illustrates a computing device in accordance with one implementation of the disclosure.

FIG. 11 illustrates a computing device 1100 in accordance with one implementation of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the disclosure, the integrated circuit die of the processor includes one or more embedded non-volatile memory structures having a 1T-1MTJ with MOBS memory device, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of embodiments of the disclosure, the integrated circuit die of the communication chip includes one or more embedded non-volatile memory structures having a 1T-1MTJ with MOBS memory device, in accordance with implementations of embodiments of the disclosure.

In further implementations, another component housed within the computing device 1100 may contain an integrated circuit die that includes one or more embedded non-volatile memory structures having a 1T-1MTJ with MOBS memory device, in accordance with implementations of embodiments of the disclosure.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Thus, embodiments described herein include embedded non-volatile memory structures having 1T-1MTJ with MOBS memory device elements.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The following examples pertain to further embodiments. The various features of the different embodiments may be variously combined with some features included and others excluded to suit a variety of different applications.

Example Embodiment 1

A memory device comprises a substrate having a front side and a backside, wherein a first conductive line is on the backside and a second conductive line is on the front side. A transistor is on the front side between the second conductive line and the substrate. A magnetic tunnel junction (MTJ) is on the backside between the first conductive line and the substrate, wherein one end of the MTJ is coupled through the substrate to the transistor and an opposite end of the MTJ is connected to the first conductive line, and wherein the transistor is further connected to the second conductive line on the front side.

Example Embodiment 2

The memory device of example embodiment 1, wherein the MTJ is connected to a drain of the transistor, and a source of the transistor is coupled to the second conductive line.

Example Embodiment 3

The memory device of claim 1 or 2, wherein the MTJ is connected to the drain of the transistor using a through via that extends through the substrate from the front side to the backside.

Example Embodiment 4

The memory device of claim 3, wherein a gate of the transistor is coupled to a word line.

Example Embodiment 5

The memory device of claim 1, 2 or 3, wherein the first conductive line comprises a bit line and the second conductive line comprises a source line.

Example Embodiment 6

The memory device of claim 5, wherein the bit line comprises a read bit line and a write bit line.

Example Embodiment 7

The memory device of claim 1, 2, 3, 4, 5 or 6, wherein the memory device comprises a 1T-1MTJ magnetic random access memory (MRAM).

Example Embodiment 8

The memory device of claim 1, 2, 3, 4, 5, 6 or 7, wherein the MTJ device includes a SOT electrode comprising GSHE material.

Example Embodiment 9

The memory device of claim 8, wherein the GSHE material comprises at least one of β-Tantalum (β-Ta), β-Tungsten (β-W), Pt, Hf, Ir, Bi, and doped Cu.

Example Embodiment 10

The memory device of claim 1, 2, 3, 4, 5, 6, 7, 8 or 9, wherein the MTJ device includes a free magnetic layer coupled the SOT electrode, wherein the SOT electrode is coupled to a write bit line; and an opposite end of the MTJ device is coupled to a read bit line.

Example Embodiment 11

The memory device of claim 1, 2, 3, 4, 5, 6, 7, 8, 9 or 10, wherein a material stack comprising the MTJ device further includes: a tunneling barrier, a fixed magnetic layer, a coupler layer, a Synthetic Antiferro-magnet (SAF)/pinning layer, and a top electrode.

Example Embodiment 12

A memory device comprises a substrate. A backside of the substrate comprises a read bit line and write bit line, and a magnetic tunnel junction (MTJ) device. A front side of the substrate comprises a source line; and a transistor controllable by a wordline and coupled to the source line.

Example Embodiment 13

The memory device of claim 12, wherein the MTJ device on the backside includes a write electrode comprising a spin hall effect material and a free magnetic layer in direct contact with the SOT electrode, wherein the SOT electrode defines one end of the MTJ device and is coupled to the write bit line; and a top electrode defines an opposite end of the MTJ device and is coupled to the read bit line.

Example Embodiment 14

The memory device of claim 12 or 13, wherein the one of drain/source terminals of the transistor on the front side is coupled through a via in the substrate to the SOT electrode on the backside.

Example Embodiment 15

The memory device of claim 14, wherein the through via is connected to a via pedestal that is in contact with one end of MTJ device.

Example Embodiment 16

The memory device of claim 12, 13, 14 or 15, wherein the memory device comprises a three terminal device, wherein the read bit line and the write bit line on the backside form a first terminal and a second terminal, and the source line forms a third terminal.

Example Embodiment 17

The memory device of claim 12, 13, 14, 15 or 16, wherein one of drain/source terminals of the transistor on the front side is coupled through the substrate to the SOT electrode on the backside, and another of the source/drain terminals is coupled to the source line on the front side.

Example Embodiment 18

The memory device of claim 12, 13, 14, 15, 16 or 17, wherein word line is coupled to a gate terminal of transistor.

Example Embodiment 19

The memory device of claim 12, 13, 14, 15, 16, 17 or 18, wherein the memory device comprises a 1T-1MTJ magnetic random access memory (MRAM).

Example Embodiment 20

The memory device of claim 12, 13, 14, 15, 16, 17, 18 or 19, wherein the MTJ device includes a SOT electrode comprising GSHE material.

Example Embodiment 21

The memory device of claim 20, wherein the GSHE material comprises at least one of β-Tantalum (β-Ta), β-Tungsten (β-W), Pt, Hf, Ir, Bi, and doped Cu.

Example Embodiment 22

The memory device of claim 19 or 20, wherein the MTJ device includes a free magnetic layer coupled the SOT electrode, wherein the SOT electrode is coupled to a write bit line; and an opposite end of the MTJ device is coupled to a read bit line.

Example Embodiment 23

The memory device of claim 22, wherein a material stack comprising the MTJ device further includes: a tunneling barrier, a fixed magnetic layer, a coupler layer, a Synthetic Antiferro-magnet (SAF)/pinning layer, and a top electrode.

Example Embodiment 24

A method of fabricating an integrated circuit device comprises forming a first substrate and a second substrate. Front-end processing is performed on the first substrate to form transistors. Back-end processing is performed over the transistors to form first contacts and electrically conductive back-end layers on the first substrate. Front-end processing is performed on the second substrate to form magnetic tunnel junctions (MTJs), Back-end processing is performed over the MTJs to form second contacts and electrically conductive back-end layers on the second substrate. The MTJs from the second substrate are then attached to the first substrate.

Example Embodiment 25

The method of claim 24, further comprising: coupling one of drain/source terminals of the transistor on a front side of the first substrate to the MTJ on a backside of the first substrate using a through a via in the substrate.

What is claimed is:
1. A memory device, comprising:
a substrate having a front side and a backside, wherein a first conductive line is on the backside and a second conductive line is on the front side;
a transistor on the front side between the second conductive line and the substrate; and
a magnetic tunnel junction (MTJ) on the backside between the first conductive line and the substrate, wherein one end of the MTJ is coupled through the substrate to the transistor and an opposite end of the MTJ is connected to the first conductive line, and wherein the transistor is further connected to the second conductive line on the front side, the MTJ device including a Spin Orbit Torque (SOT) electrode comprising a spin hall effect material and a free magnetic layer coupled to the SOT electrode, wherein the SOT electrode is coupled to the second conductive line, and an opposite end of the MTJ device is coupled to the first conductive line.

2. The memory device of claim 1, wherein the MTJ is connected to a drain of the transistor, and a source of the transistor is coupled to the second conductive line.

3. The memory device of claim 2, wherein the MTJ is connected to the drain of the transistor using a through via that extends through the substrate from the front side to the backside.

4. The memory device of claim 3, wherein a gate of the transistor is coupled to a word line.

5. The memory device of claim 1, wherein the first conductive line comprises a bit line and the second conductive line comprises a source line.

6. The memory device of claim 5, wherein the bit line comprises a read bit line and a write bit line.

7. The memory device of claim 1, wherein the memory device comprises a 1transistor-1 magnetic tunnel junction (MTJ) (1T-1MTJ) magnetic random access memory (MRAM).

8. The memory device of claim 1, wherein the MTJ device includes a SOT electrode comprising Giant Spin Hall Effect (GSHE) material, wherein the GSHE material comprises at least one of β-Tantalum (β-Ta), β-Tungsten (β-W), Pt, Hf, Ir, Bi, and doped Cu.

9. The memory device of claim 1, wherein a material stack comprising the MTJ device further includes: a tunneling barrier, a fixed magnetic layer, a coupler layer, a Synthetic Antiferro-magnet (SAF)/pinning layer, and a top electrode.

10. A memory device, comprising:
a substrate;
a backside of the substrate comprising:
  a read bit line and write bit line; and
  a magnetic tunnel junction (MTJ) device; and
a front side of the substrate comprising:
  a source line; and
  a transistor controllable by a wordline and coupled to the source line,
wherein the MTJ device includes a Spin Orbit Torque (SOT) electrode comprising a spin hall effect material and a free magnetic layer in direct contact with the SOT electrode, wherein the SOT electrode defines one end of the MTJ device and is coupled to the write bit line; and a top electrode defines an opposite end of the MTJ device and is coupled to the read bit line.

11. The memory device of claim 10, wherein the one of drain/source terminals of the transistor on the front side is coupled through a via in the substrate to the SOT electrode on the backside.

12. The memory device of claim 11, wherein the through via is connected to a via pedestal that is in contact with one end of MTJ device.

13. The memory device of claim 10, wherein the memory device comprises a three terminal device, wherein the read bit line and the write bit line on the backside form a first terminal and a second terminal, and the source line forms a third terminal.

14. The memory device of claim 10, wherein one of drain/source terminals of the transistor on the front side is coupled through the substrate to the SOT electrode on the backside, and another of the source/drain terminals is coupled to the source line on the front side.

15. The memory device of claim 10, wherein word line is coupled to a gate terminal of transistor.

16. The memory device of claim 10, wherein the memory device comprises a 1transistor-1 magnetic tunnel junction (MTJ) (1T-1MTJ) magnetic random access memory (MRAM).

17. The memory device of claim 16, wherein the MTJ device includes a SOT electrode comprising Giant Spin Hall Effect (GSHE) material.

18. The memory device of claim 16, wherein the GSHE material comprises at least one of β-Tantalum (β-Ta), β-Tungsten (β-W), Pt, Hf, Ir, Bi, and doped Cu.

19. The memory device of claim 17, wherein the MTJ device includes a free magnetic layer coupled the SOT electrode, wherein the SOT electrode is coupled to a write bit line; and an opposite end of the MTJ device is coupled to a read bit line.

20. The memory device of claim 19, wherein a material stack comprising the MTJ device further includes: a tunneling barrier, a fixed magnetic layer, a coupler layer, a Synthetic Antiferro-magnet (SAF)/pinning layer, and a top electrode.

* * * * *